US008536462B1

(12) United States Patent
Darveaux et al.

(10) Patent No.: US 8,536,462 B1
(45) Date of Patent: Sep. 17, 2013

(54) FLEX CIRCUIT PACKAGE AND METHOD

(75) Inventors: Robert Francis Darveaux, Gilbert, AZ (US); Ludovico E. Bancod, Chandler, AZ (US); Marnie Ann Mattei, Phoenix, AZ (US); Timothy Lee Olson, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 316 days.

(21) Appl. No.: 12/692,397

(22) Filed: Jan. 22, 2010

(51) Int. Cl.
*H05K 1/16* (2006.01)
*H05K 1/00* (2006.01)

(52) U.S. Cl.
USPC ........... 174/260; 174/254; 174/262; 174/264; 361/792

(58) Field of Classification Search
None
See application file for complete search history.

(56) References Cited

U.S. PATENT DOCUMENTS

| | | | |
|---|---|---|---|
| 3,148,310 A * | 9/1964 | Feldman | 174/265 |
| 3,868,724 A | 2/1975 | Perrino | |
| 3,916,434 A | 10/1975 | Garboushian | |
| 4,322,778 A | 3/1982 | Barbour et al. | |
| 4,532,419 A | 7/1985 | Takeda | |
| 4,642,160 A | 2/1987 | Burgess | |
| 4,645,552 A | 2/1987 | Vitriol et al. | |
| 4,685,033 A | 8/1987 | Inoue | |
| 4,706,167 A | 11/1987 | Sullivan | |
| 4,716,049 A | 12/1987 | Patraw | |
| 4,786,952 A | 11/1988 | MacIver et al. | |
| 4,806,188 A | 2/1989 | Rellick | |
| 4,811,082 A | 3/1989 | Jacobs et al. | |
| 4,897,338 A | 1/1990 | Spicciati et al. | |
| 4,905,124 A | 2/1990 | Banjo et al. | |
| 4,964,212 A | 10/1990 | Deroux-Dauphin et al. | |
| 4,974,120 A | 11/1990 | Kodai et al. | |
| 4,996,391 A | 2/1991 | Schmidt | |
| 5,021,047 A | 6/1991 | Movern | |
| 5,072,075 A | 12/1991 | Lee et al. | |
| 5,072,520 A | 12/1991 | Nelson | |
| 5,081,520 A | 1/1992 | Yoshii et al. | |
| 5,091,769 A | 2/1992 | Eichelberger | |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993.

(Continued)

*Primary Examiner* — Jayprakash N Gandhi
*Assistant Examiner* — Dion Ferguson
(74) *Attorney, Agent, or Firm* — McKay and Hodgson, LLP; Serge J. Hodgson

(57) ABSTRACT

A flex circuit package includes a package body enclosing an electronic component and a first surface of the substrate. Columns are physically and electrically connected to first traces of the substrate, the columns extending through the package body. A flexible circuit connector has first terminals connected to the columns. The flexible circuit connector further includes second terminals that provide an electrical interconnection structure for electrical connection to a second electronic component structure. By connecting the flexible circuit connector to the columns extending through the package body, special routing of traces of the substrate of the flex circuit package to provide an interface for the flexible circuit connector is avoided.

20 Claims, 7 Drawing Sheets

(56) References Cited

U.S. PATENT DOCUMENTS

| | | | |
|---|---|---|---|
| 5,108,553 A | 4/1992 | Foster et al. | |
| 5,110,664 A | 5/1992 | Nakanishi et al. | |
| 5,191,174 A | 3/1993 | Chang et al. | |
| 5,229,550 A | 7/1993 | Bindra et al. | |
| 5,239,448 A | 8/1993 | Perkins et al. | |
| 5,247,429 A | 9/1993 | Iwase et al. | |
| 5,250,843 A | 10/1993 | Eichelberger | |
| 5,278,726 A | 1/1994 | Bernardoni et al. | |
| 5,283,459 A | 2/1994 | Hirano et al. | |
| 5,353,498 A | 10/1994 | Fillion et al. | |
| 5,371,654 A | 12/1994 | Beaman et al. | |
| 5,379,191 A | 1/1995 | Carey et al. | |
| 5,401,911 A * | 3/1995 | Anderson et al. | 174/262 |
| 5,404,044 A | 4/1995 | Booth et al. | |
| 5,463,253 A | 10/1995 | Waki et al. | |
| 5,474,957 A | 12/1995 | Urushima | |
| 5,474,958 A | 12/1995 | Djennas et al. | |
| 5,497,033 A | 3/1996 | Fillion et al. | |
| 5,508,938 A | 4/1996 | Wheeler | |
| 5,530,288 A | 6/1996 | Stone | |
| 5,531,020 A | 7/1996 | Durand et al. | |
| 5,546,654 A | 8/1996 | Wojnarowski et al. | |
| 5,574,309 A | 11/1996 | Papapietro et al. | |
| 5,581,498 A | 12/1996 | Ludwig et al. | |
| 5,582,858 A | 12/1996 | Adamopoulos et al. | |
| 5,616,422 A | 4/1997 | Ballard et al. | |
| 5,637,832 A | 6/1997 | Danner | |
| 5,674,785 A | 10/1997 | Akram et al. | |
| 5,719,749 A | 2/1998 | Stopperan | |
| 5,726,493 A | 3/1998 | Yamashita et al. | |
| 5,739,581 A | 4/1998 | Chillara | |
| 5,739,585 A | 4/1998 | Akram et al. | |
| 5,739,588 A | 4/1998 | Ishida et al. | |
| 5,742,479 A | 4/1998 | Asakura | |
| 5,774,340 A | 6/1998 | Chang et al. | |
| 5,784,259 A | 7/1998 | Asakura | |
| 5,798,014 A | 8/1998 | Weber | |
| 5,822,190 A | 10/1998 | Iwasaki | |
| 5,826,330 A | 10/1998 | Isoda et al. | |
| 5,835,355 A | 11/1998 | Dordi | |
| 5,847,453 A | 12/1998 | Uematsu et al. | |
| 5,883,425 A | 3/1999 | Kobayashi | |
| 5,894,108 A | 4/1999 | Mostafazadeh et al. | |
| 5,903,052 A | 5/1999 | Chen et al. | |
| 5,907,477 A | 5/1999 | Tuttle et al. | |
| 5,936,843 A | 8/1999 | Ohshima et al. | |
| 5,952,611 A | 9/1999 | Eng et al. | |
| 6,004,619 A | 12/1999 | Dippon et al. | |
| 6,013,948 A | 1/2000 | Akram et al. | |
| 6,021,564 A | 2/2000 | Hanson | |
| 6,028,364 A | 2/2000 | Ogino et al. | |
| 6,034,427 A | 3/2000 | Lan et al. | |
| 6,035,527 A | 3/2000 | Tamm | |
| 6,040,622 A | 3/2000 | Wallace | |
| 6,060,778 A | 5/2000 | Jeong et al. | |
| 6,069,407 A | 5/2000 | Hamzehdoost | |
| 6,072,243 A | 6/2000 | Nakanishi | |
| 6,081,036 A | 6/2000 | Hirano et al. | |
| 6,119,338 A | 9/2000 | Wang et al. | |
| 6,122,171 A | 9/2000 | Akram et al. | |
| 6,127,833 A | 10/2000 | Wu et al. | |
| 6,160,705 A | 12/2000 | Stearns et al. | |
| 6,172,419 B1 | 1/2001 | Kinsman | |
| 6,175,087 B1 | 1/2001 | Keesler et al. | |
| 6,184,463 B1 | 2/2001 | Panchou et al. | |
| 6,194,250 B1 | 2/2001 | Melton et al. | |
| 6,204,453 B1 | 3/2001 | Fallon et al. | |
| 6,214,641 B1 | 4/2001 | Akram | |
| 6,235,554 B1 | 5/2001 | Akram et al. | |
| 6,239,485 B1 | 5/2001 | Peters et al. | |
| D445,096 S | 7/2001 | Wallace | |
| D446,525 S | 8/2001 | Okamoto et al. | |
| 6,274,821 B1 | 8/2001 | Echigo et al. | |
| 6,280,641 B1 | 8/2001 | Gaku et al. | |
| 6,316,285 B1 | 11/2001 | Jiang et al. | |
| 6,351,031 B1 | 2/2002 | Iijima et al. | |
| 6,353,999 B1 | 3/2002 | Cheng | |
| 6,365,975 B1 | 4/2002 | DiStefano et al. | |
| 6,376,906 B1 | 4/2002 | Asai et al. | |
| 6,392,160 B1 | 5/2002 | Andry et al. | |
| 6,395,578 B1 | 5/2002 | Shin et al. | |
| 6,405,431 B1 | 6/2002 | Shin et al. | |
| 6,406,942 B2 | 6/2002 | Honda | |
| 6,407,341 B1 | 6/2002 | Anstrom et al. | |
| 6,407,930 B1 | 6/2002 | Hsu | |
| 6,448,510 B1 | 9/2002 | Neftin et al. | |
| 6,451,509 B2 | 9/2002 | Keesler et al. | |
| 6,479,762 B2 | 11/2002 | Kusaka | |
| 6,497,943 B1 | 12/2002 | Jimarez et al. | |
| 6,517,995 B1 | 2/2003 | Jacobson et al. | |
| 6,534,391 B1 | 3/2003 | Huemoeller et al. | |
| 6,544,638 B2 | 4/2003 | Fischer et al. | |
| 6,586,682 B2 | 7/2003 | Strandberg | |
| 6,608,757 B1 | 8/2003 | Bhatt et al. | |
| 6,660,559 B1 | 12/2003 | Huemoeller et al. | |
| 6,715,204 B1 | 4/2004 | Tsukada et al. | |
| 6,727,645 B2 | 4/2004 | Tsujimura et al. | |
| 6,730,857 B2 | 5/2004 | Konrad et al. | |
| 6,734,542 B2 | 5/2004 | Nakatani et al. | |
| 6,740,964 B2 | 5/2004 | Sasaki | |
| 6,753,612 B2 | 6/2004 | Adae-Amoakoh et al. | |
| 6,774,748 B1 | 8/2004 | Ito et al. | |
| 6,787,443 B1 | 9/2004 | Boggs et al. | |
| 6,803,528 B1 | 10/2004 | Koyanagi | |
| 6,815,709 B2 | 11/2004 | Clothier et al. | |
| 6,815,739 B2 | 11/2004 | Huff et al. | |
| 6,838,776 B2 | 1/2005 | Leal et al. | |
| 6,888,240 B2 | 5/2005 | Towle et al. | |
| 6,919,514 B2 | 7/2005 | Konrad et al. | |
| 6,921,968 B2 | 7/2005 | Chung | |
| 6,921,975 B2 | 7/2005 | Leal et al. | |
| 6,931,726 B2 | 8/2005 | Boyko et al. | |
| 6,953,995 B2 | 10/2005 | Farnworth et al. | |
| 7,015,075 B2 | 3/2006 | Fay et al. | |
| 7,030,469 B2 | 4/2006 | Mahadevan et al. | |
| 7,081,661 B2 | 7/2006 | Takehara et al. | |
| 7,125,744 B2 | 10/2006 | Takehara et al. | |
| 7,141,874 B2 * | 11/2006 | Nakatani | 257/700 |
| 7,185,426 B1 | 3/2007 | Hiner et al. | |
| 7,198,980 B2 | 4/2007 | Jiang et al. | |
| 7,242,081 B1 | 7/2007 | Lee | |
| 7,282,394 B2 | 10/2007 | Cho et al. | |
| 7,285,855 B2 | 10/2007 | Foong | |
| 7,345,361 B2 | 3/2008 | Mallik et al. | |
| 7,372,151 B1 | 5/2008 | Fan et al. | |
| 7,429,786 B2 | 9/2008 | Karnezos et al. | |
| 7,459,202 B2 | 12/2008 | Magera et al. | |
| 7,548,430 B1 | 6/2009 | Huemoeller et al. | |
| 7,550,857 B1 | 6/2009 | Longo et al. | |
| 7,714,453 B2 * | 5/2010 | Khan et al. | 257/787 |
| 2002/0017712 A1 | 2/2002 | Bessho et al. | |
| 2002/0061642 A1 | 5/2002 | Haji et al. | |
| 2002/0066952 A1 | 6/2002 | Taniguchi et al. | |
| 2002/0195697 A1 | 12/2002 | Mess et al. | |
| 2003/0025199 A1 | 2/2003 | Wu et al. | |
| 2003/0128096 A1 | 7/2003 | Mazzochette | |
| 2003/0141582 A1 | 7/2003 | Yang et al. | |
| 2003/0197284 A1 | 10/2003 | Khiang et al. | |
| 2004/0063246 A1 | 4/2004 | Karnezos | |
| 2004/0145044 A1 | 7/2004 | Sugaya et al. | |
| 2004/0159462 A1 | 8/2004 | Chung | |
| 2005/0139985 A1 | 6/2005 | Takahashi | |
| 2005/0242425 A1 | 11/2005 | Leal et al. | |
| 2006/0272850 A1 * | 12/2006 | Morimoto et al. | 174/254 |
| 2007/0273049 A1 | 11/2007 | Khan et al. | |
| 2007/0281471 A1 | 12/2007 | Hurwitz et al. | |
| 2007/0290376 A1 | 12/2007 | Zhao et al. | |
| 2008/0230887 A1 | 9/2008 | Sun et al. | |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Scanlan et al., "Semiconductor Package Including a Top-Surface Metal Layer for Implementing Circuit Features", U.S. Appl. No. 11/293,999, filed Dec. 5, 2005.

Hiner et al,, "Semiconductor Package Including Top-Surface Terminals for Mounting Another Semiconductor Package", U.S. Appl. No. 11/595,411, filed Nov. 9, 2006.

Huemoeller et al., "Build Up Motherboard Fabrication Method and Structure", U.S. Appl. No. 11/824,395, filed Jun. 29, 2007.

Berry et al., "Thin Stacked Interposer Package", U.S. Appl. No. 11/865,617, filed Oct. 1, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

Yoshida et al., "Stackable Via Package and Method", U.S. Appl. No. 12/483,913, filed Jun. 12, 2009.

* cited by examiner

FLEX CIRCUIT PACKAGE AND METHOD

BACKGROUND OF THE INVENTION

1. Field of the Invention

The present application relates to the field of electronics, and more particularly, to methods of forming electronic component packages and related structures.

2. Description of the Related Art

An electronic component package is mounted to a printed circuit board, sometimes called a printed circuit motherboard. One end of a flexible circuit connector is also mounted to the printed circuit board. The other end of the flexible circuit connector is mounted to a second electronic component structure. In this manner, the flexible circuit connector is used to electrically interconnect the printed circuit board and the electronic component package mounted thereto to the second electronic component structure.

There are many different types of flexible circuit connectors. Typically, a flexible circuit connector includes an electrically conductive circuit on a flexible dielectric substrate, for example, on a polyimide film. The flexible circuit connector is flexible and durable allowing a flexible and robust interconnection between the printed circuit board and the second electronic component structure.

SUMMARY OF THE INVENTION

In accordance with one embodiment, a flex circuit package includes an electronic component mounted to a first surface of a substrate. The substrate includes first traces on the first surface of the substrate, the first traces being electrically connected to the electronic component.

A package body encloses the electronic component and the first surface of the substrate. Columns are physically and electrically connected to the first traces, the columns extending through the package body.

A flexible circuit connector has first terminals connected to the columns. The flexible circuit connector further includes second terminals that provide an electrical interconnection structure for electrical connection to a second electronic component structure.

By connecting the flexible circuit connector to the columns extending through the package body, e.g., through the mold compound, special routing of traces of the substrate of the flex circuit package to provide an interface for the flexible circuit connector is avoided. Further, special routing of traces of the printed circuit board to which the flex circuit package is mounted to provide an interface for the flexible circuit connector is also avoided. Accordingly, maximum flexibility in the routing of traces of the substrate and of the printed circuit board to which the flex circuit package is mounted is provided.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
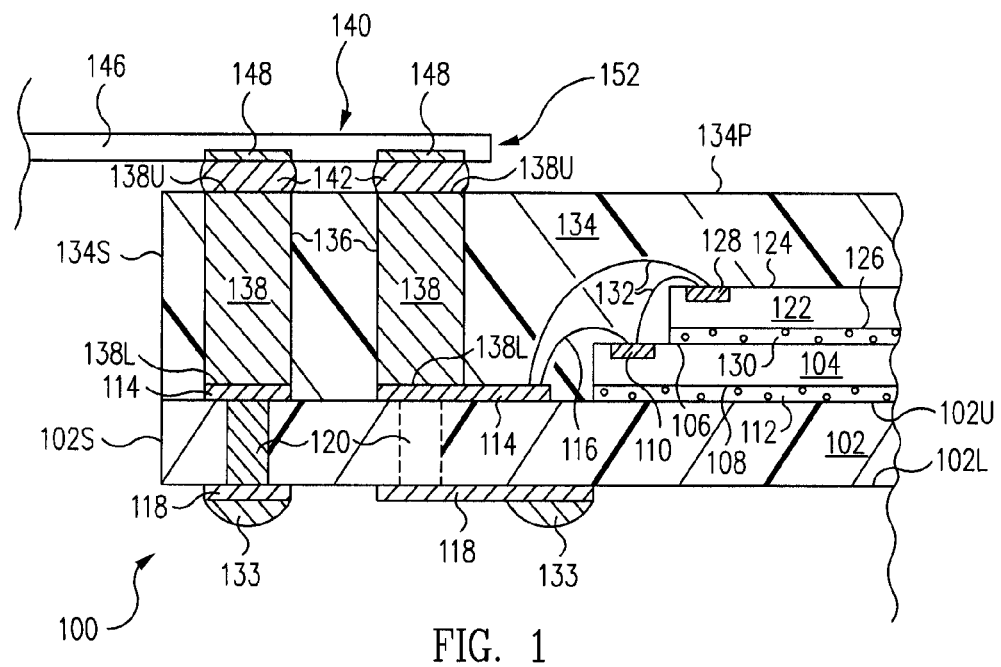
FIG. 1 is a cross-sectional view of a flex circuit package in accordance with one embodiment.
Figure 2:
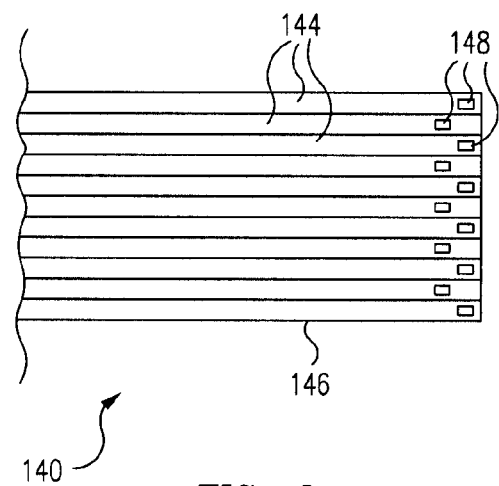
FIG. 2 is a bottom plan view of a flexible circuit connector of the flex circuit package of FIG. 1.
Figure 3:
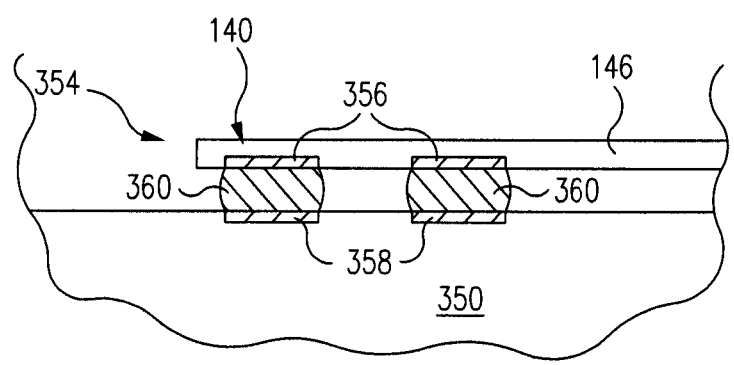
FIG. 3 is a cross-sectional view of the flexible circuit connector of FIGS. 1 and 2 electrically and physically connected to a second electronic component structure in accordance with one embodiment.

As an overview and in accordance with one embodiment, referring to FIGS. 1, 2, and 3 together, a flex circuit package 100 includes an electronic component 104 mounted to an upper surface 102U of a substrate 102. Substrate 102 includes upper traces 114 on upper surface 102U of substrate 102, upper traces 114 being electrically connected to electronic component 104.

A package body 134 encloses electronic component 104 and upper surface 102U of substrate 102. Columns 138 are physically and electrically connected to upper traces 114, columns 138 extending through package body 134. A flexible circuit connector 140 has first terminals 148 connected to columns 138. Flexible circuit connector 140 further includes second terminals 356 (see FIG. 3) that provide an electrical interconnection structure for electrical connection to a second electronic component structure 350.

By connecting flexible circuit connector 140 to columns 138 extending through package body 134, e.g., through the mold compound, special routing of upper traces 114 of substrate 102 of flex circuit package 100 to provide an interface for flexible circuit connector 140 is avoided. Further, special routing of traces of the printed circuit board to which the flex circuit package 100 is mounted to provide an interface for flexible circuit connector 140 is also avoided. Accordingly, maximum flexibility in the routing of upper traces 114 of substrate 102 and of the printed circuit board to which flex circuit package 100 is mounted is provided.

Now in more detail, FIG. 1 is a cross-sectional view of a flex circuit package 100 in accordance with one embodiment. Flex circuit package 100, sometimes called an electronic component package, includes a substrate 102 including an upper, e.g., first, surface 102U and an opposite lower, e.g., second, surface 102L. Substrate 102 further includes sides 102S extending perpendicularly between upper surface 102U and lower surface 102L. Substrate 102 is a dielectric material such as laminate, ceramic, printed circuit board material, or other dielectric material.

Flex circuit package 100 further includes an electronic component 104. In one embodiment, electronic component 104 is an integrated circuit chip, e.g., an active component. However, in other embodiments, electronic component 104 is a passive component such as a capacitor, resistor, or inductor.

In accordance with this embodiment, electronic component 104 includes an active surface 106 and an opposite inactive surface 108. Electronic component 104 further includes bond pads 110 formed on active surface 106. Inactive surface 108 is mounted to upper surface 102U of substrate 102 with an adhesive 112, e.g., a film adhesive.

Formed on upper surface 102U of substrate 102 are electrically conductive upper, e.g., first, traces 114, e.g., formed of copper. Bond pads 110 are electrically connected to upper traces 114, e.g., bond fingers thereof, by electrically conductive bond wires 116.

Formed on lower surface 102L of substrate 102 are lower, e.g., second, traces 118. Lower traces 118 are electrically connected to upper traces 114 by electrically conductive vias 120 extending through substrate 102 between upper surface 102U and lower surface 102L.

Although not illustrated in FIG. 1, in one embodiment, flex circuit package 100 further includes solder masks on upper and lower surface 102U, 102L that protect first portions of upper and lower traces 114, 118 while exposing second portions, e.g., terminals and/or bond fingers, of upper and lower traces 114, 118.

Although a particular electrically conductive pathway between bond pads 110 and lower traces 118 is described above, other electrically conductive pathways can be formed. For example, contact metallizations can be formed between the various electrical conductors.

Further, instead of straight though vias 120, in one embodiment, substrate 102 is a multilayer substrate and a plurality of vias and/or internal traces form the electrical interconnection between upper traces 114 and lower traces 118.

In accordance with one embodiment, one or more of upper traces 114 is not electrically connected to a lower traces 118, i.e., is electrically isolated from lower traces 118, and electrically connected to bond pads 110. To illustrate, the upper trace 114 at the right in FIG. 1 is electrically isolated from lower traces 118 and electrically connected to a respective bond pad 110. In accordance with this embodiment, the respective bond pad 110 electrically connected to the upper trace 114 at the right is also electrically isolated from lower traces 118.

In accordance with one embodiment, one or more of upper traces 114 is electrically connected to both bond pads 110 and to lower traces 118. To illustrate, the upper trace 114 at the right is electrically connected to a respective bond pad 110 and to one or more lower traces 118 by a via 120 indicated by the dashed lines. In accordance with this embodiment, the respective bond pad 110 electrically connected to the upper trace 114 at the right is also electrically connected to lower traces 118. The respective via 120 is indicated in dashed lines to illustrate that the via 120 is not formed in one example thus electrically isolating the upper trace 114 at the right from lower traces 118 and that the via 120 is formed in another example thus electrically connecting the upper trace 114 at the right to lower traces 118.

In accordance with one embodiment, one or more of upper traces 114 is not electrically connected to a bond pad 110, i.e., is electrically isolated from bond pads 110, and electrically connected to lower traces 118. To illustrate, the upper trace 114 at the left in FIG. 1 is electrically isolated from bond pads 110 and electrically connected to lower trace(s) 118. In accordance with this embodiment, the respective lower trace(s) 118 electrically connected to the upper trace 114 at the left are electrically isolated from bond pads 110.

Optionally, a second electronic component 122 is stacked upon electronic component 104, sometimes called a first electronic component. In one embodiment, second electronic component 122 is an integrated circuit chip, e.g., an active component. However, in other embodiments, second electronic component 122 is a passive component such as a capacitor, resistor, or inductor.

In accordance with this embodiment, second electronic component 122 includes an active surface 124 and an opposite inactive surface 126. Second electronic component 122 further includes bond pads 128 formed on active surface 124. Inactive surface 126 is mounted to active surface 106 of electronic component 104 with an adhesive 130, e.g., a film adhesive.

Bond pads 128 are electrically connected to upper traces 114, e.g., bond fingers thereof, and/or to bond pads 110 of electronic component 104, by electrically conductive bond wires 132.

Interconnection balls 133 are formed on lower traces 118, e.g., terminals thereof. Interconnection balls 133, e.g., a ball grid array (BGA), are used to electrically interconnect flex circuit package 100 to another structure such as a printed circuit motherboard.

Second electronic component 122 is optional, and in one embodiment, flex circuit package 100 is formed without second electronic component 122. Further, although wirebond configurations for electronic components 104, 122 are discussed above and illustrated in FIG. 1, in other embodiments, electronic component 104 and/or electronic component 122 are mounted in a flip chip or other configuration.

Although various examples of connections between bond pads 110, 128, upper traces 114, lower traces 118, vias 120, bond wires 116, 132, and interconnection balls 133 are set forth above, in light of this disclosure, those of skill in the art will understand that any one of a number of electrical configurations are possible depending upon the particular application.

Electronic components 104, 122, bond wires 116, 132 and the exposed portions of upper surface 102U including upper traces 114 are enclosed, sometimes called encased, encapsulated, and/or covered, with a package body 134. Illustratively, package body 134 is a cured liquid encapsulant, molding compound, or other dielectric material. Package body 134 protects electronic components 104, 122, bond wires 116, 132, and the exposed portions of upper surface 102U including upper traces 114 from the ambient environment, e.g., from contact, moisture and/or shorting to other structures.

Package body 134 includes a principal surface 134P parallel to upper surface 102U of substrate 102. In accordance with this embodiment, package body 134 includes sides 134S extending perpendicularly between substrate 102 and principal surface 134P. Sides 134S are parallel to and lie in the same plane as sides 102S of substrate 102. Thus, package body 134 entirely covers upper traces 114.

Illustratively, flex circuit package 100 is formed simultaneously with a plurality of packages in an array or strip. The array or strip is singulated resulting in sides 134S of package body 134 parallel to and lying in the same plane as sides 102S of substrate 102.

Although the terms parallel, perpendicular, and similar terms are used herein, it is to be understood that the described features may not be exactly parallel and perpendicular, but only substantially parallel and perpendicular to within excepted manufacturing tolerances.

Flex circuit package 100 further includes through via apertures 136 penetrating into package body 134 from principal surface 134P. In one embodiment, through via apertures 136 are formed using a laser-ablation process. More particularly, a laser is repeatedly directed at principal surface 134P perpendicularly to principal surface 134P. This laser ablates, i.e., removes, portions of package body 134 leaving through via apertures 136, sometimes called through holes.

Although a laser-ablation process for formation of through via apertures 136 is set forth above, in other embodiments, other via apertures formation techniques are used. For example, through via apertures 136 are formed using selective molding, milling, mechanical drilling, high pressure water drilling, burning, honing, grinding, electro discharge machining, chemical etching and/or other via aperture formation techniques.

As illustrated in FIG. 1, through via apertures 136 extend between principal surface 134P of package body 134 and upper traces 114, e.g., terminals of upper traces 114. Accordingly, upper traces 114 are exposed by through via apertures 136.

In accordance with this embodiment, through via apertures 136 have a uniform diameter, i.e., have a cylindrical shape. However, in another embodiment, through via apertures 136 taper from principal surface 134P to upper traces 114. More particularly, the diameter of through via apertures 136 in a plane parallel to principal surface 134P is greatest at principal surface 134P and smallest at upper traces 114 and gradually diminishes between principal surface 134P and upper traces 114.

In yet another embodiment, through via apertures 136 taper from upper traces 114 to principal surface 134P. More particularly, the diameter of through via apertures 136 in a plane parallel to principal surface 134P is smallest at principal surface 134P and greatest at upper traces 114 and gradually increases between principal surface 134P and upper traces 114.

Further, electrically conductive columns 138 are formed within through via apertures 136. More particularly, through via apertures 136 are filled with an electrically conductive material e.g., solder, plated copper, electrically conductive adhesive, to form columns 138 in direct physical and electrical contact with upper traces 114.

Columns 138 extend between principal surface 134P of package body 134 and upper traces 114. Columns 138 have upper, e.g., first, surfaces 138U and lower, e.g., second, surfaces 138L. Upper surfaces 138U are parallel to and lie in the same plane as principal surface 134P of package body 134. Lower surfaces 138L contact upper traces 114 and thus are parallel to and lie in the same plane as upper traces 114.

In accordance with this embodiment, columns 138 completely fill through via apertures 136. However, in another embodiment, columns 138 only partially fill through via apertures 136 such that upper surfaces 138U are recessed below principal surface 134P. Columns 138 extend between upper surfaces 138U and lower surfaces 138L.

A flexible circuit connector 140 is electrically connected to columns 138 by electrically conductive bumps 142, e.g., formed of solder, electrically conductive adhesive, or other electrically conductive material.

FIG. 2 is a bottom plan view of flexible circuit connector 140 of flex circuit package 100 of FIG. 1. Referring to FIGS. 1 and 2 together, flexible circuit connector 140 includes an electrically conductive circuit 144 on a flexible dielectric substrate 146, for example, on a polyimide film. Circuit 144 includes a plurality of electrically conductive terminals 148, sometimes called first terminals. Columns 138, e.g., upper surfaces 138U thereof, are electrically and physically connected to terminals 148 and thus to circuit 144 by bumps 142, sometimes called a flex circuit connectivity interface.

FIG. 3 is a cross-sectional view of flexible circuit connector 140 of FIGS. 1 and 2 electrically and physically connected to a second electronic component structure 350 in accordance with one embodiment. Referring now to FIGS. 1, 2, and 3 together, a first end 152 of flexible circuit connector 140 is connected to columns 138 as discussed above. First end 152 includes terminals 148.

A second end 354 of flexible circuit connector 140 is electrically and physically connected to second electronic component structure 350. More particularly, terminals 356, sometimes called second terminals, of circuit 144 of flexible circuit connector 140 are electrically and physically connected to terminals 358 of second electronic component structure 350 by bumps 360, e.g., formed of solder, electrically conductive adhesive, or other electrically conductive material. Terminals 356 provide an electrical interconnection structure for electrical connection to second electronic component structure 350.

Terminals 356 are electrically connected to terminals 148 by circuit 144. Accordingly, columns 138 and the associated electrically conductive elements of flex circuit package 100, i.e., bond pads 110, 128, bond wires 116, 132, traces 114, 118, vias 120, interconnection balls 133, and/or combinations of these elements, are electrically connected to terminals 358 of second electronic component structure 350 by flexible circuit connector 140.

In this manner, special routing of traces, e.g., upper traces 114 and/or lower traces 118, of substrate 102 to provide an interface for flexible circuit connector 140 is avoided. Further, routing of traces of the printed circuit board, e.g., a printed circuit motherboard, (not illustrated) to which flex circuit package 100 is mounted, e.g., by interconnection balls 133, to provide an interface for flexible circuit connector 140 is also avoided. Accordingly, maximum flexibility in the routing of traces of substrate 102 and the printed circuit board to which flex circuit package 100 is mounted is provided.

Figure 4:
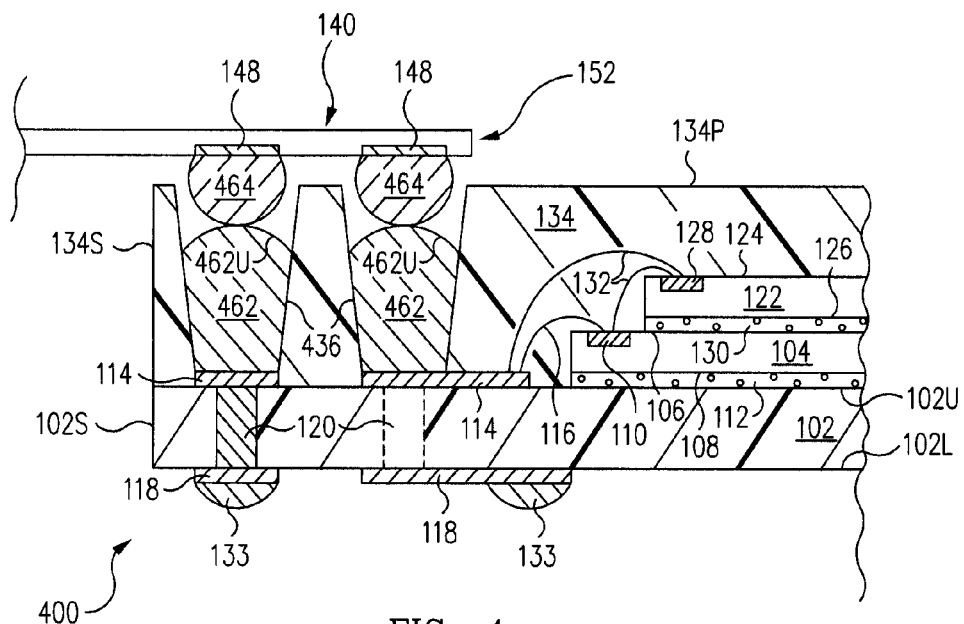
FIG. 4 is a cross-sectional view of a flex circuit package during fabrication in accordance with one embodiment.

FIG. 4 is a cross-sectional view of a flex circuit package 400 during fabrication in accordance with one embodiment. Flex circuit package 400 of FIG. 4 is similar to flex circuit package 100 of FIG. 1 and only the significant differences are discussed below.

Referring now to FIG. 4, in accordance with this embodiment, flex circuit package 400 includes through via apertures 436. Through via apertures 436 taper from principal surface 134P to upper traces 114 (in contrast, recall that through via apertures 136 of flex circuit package 100 of FIG. 1 have a uniform diameter). Through via apertures 436 are formed in a manner similar to that discussed above regarding through via apertures 136 of flex circuit package 100 of FIG. 1 and so the description is not repeated here. Generally, any of the via apertures as set forth herein can taper (up or down) or be cylindrical.

After formation, through via apertures 436 are partially or completely filled with electrically conductive fillers 462. For example, fillers 462 are solder, plated copper, electrically conductive adhesive, or other electrically conductive material. Fillers 462 contact and are electrically connected to upper traces 114, e.g., terminals thereof.

Fillers 462 have upper surface 462U recessed below principal surface 134P of package body 134 in accordance with this embodiment. Accordingly, through via apertures 436 are only partially filled by fillers 462.

Electrically conductive bumps 464, e.g., solder, are formed on terminals 148 of flexible circuit connector 140. Bumps 464 are placed into contact with fillers 462 and extend within through via apertures 436 in accordance with this example. Bumps 464 and/or fillers 462 are then reflowed, i.e., heated to a melt and then cooled to re-solidify.

Figure 5:
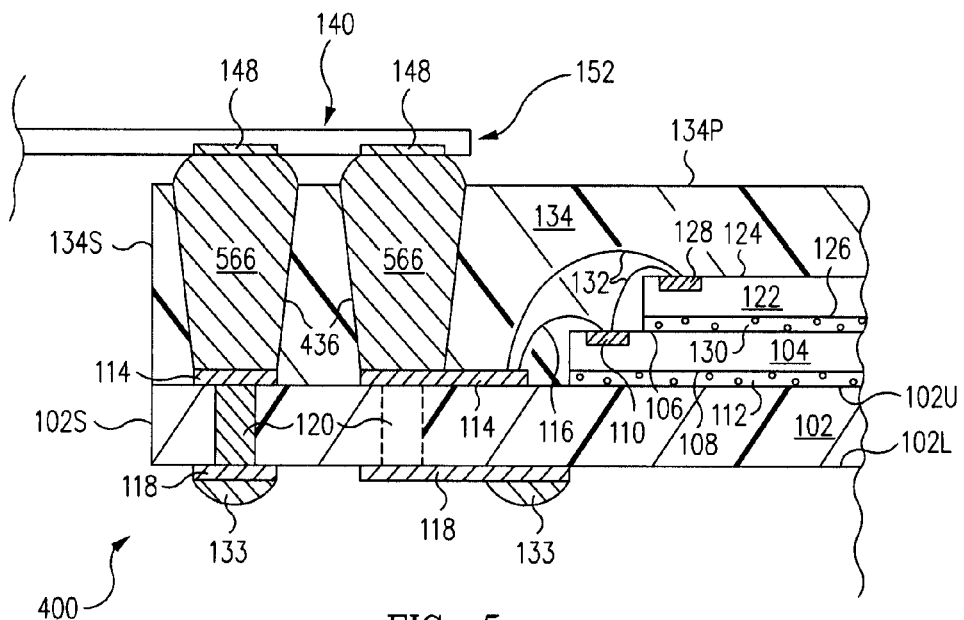
FIG. 5 is a cross-sectional view of the flex circuit package of FIG. 4 after reflow in accordance with one embodiment.

FIG. 5 is a cross-sectional view of flex circuit package 400 of FIG. 4 after reflow in accordance with one embodiment.

Referring now to FIGS. 4 and 5 together, bumps 464 and fillers 462 fuse together during reflow to form electrically conductive columns 566. Columns 566 extend between, directly contact, and electrically connect traces 114, e.g., terminals thereof, and terminals 148 of flexible circuit connector 140. Columns 566 protrude above principal surface 134P of package body 134 thus facilitating connection with terminals 148 of flexible circuit connector 140.

Referring still to FIG. 5, in accordance with another embodiment, columns 566, sometimes called proud solder, are formed prior to attachment of flexible circuit connector 140. For example, columns 566 are formed in a manner similar to that disclosed in Yoshida et al., U.S. patent application Ser. No. 12/483,913, filed on Jun. 12, 2009, entitled "STACKABLE VIA PACKAGE AND METHOD", which is herein incorporated by reference in its entirety.

In accordance with this embodiment, columns 566 protrude above principal surface 134P of package body 134 as illustrated in FIG. 5 prior to connection with flexible circuit connector 140. After formation of columns 566, terminals 148 of flexible circuit connector 140 are placed into contact with columns 566. Columns 566 are reflowed to mount terminals 148 of flexible circuit connector 140 to columns 566 resulting in flex circuit package 400 at the stage illustrated in FIG. 5.

Figure 6:
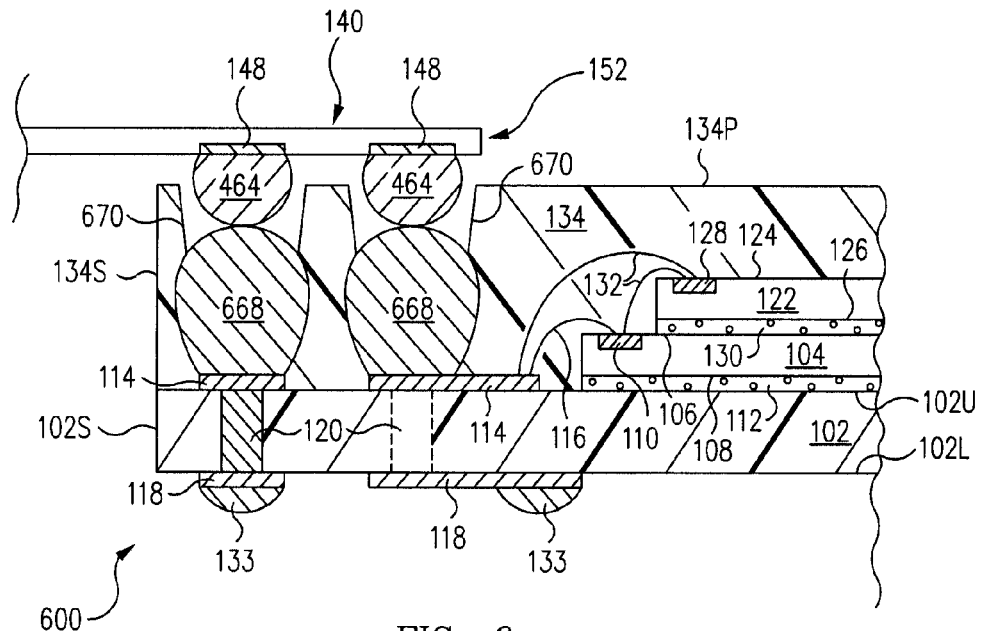
FIG. 6 is a cross-sectional view of a flex circuit package during fabrication in accordance with one embodiment.

FIG. 6 is a cross-sectional view of a flex circuit package 600 during fabrication in accordance with one embodiment. Flex circuit package 600 of FIG. 6 is similar to flex circuit package 400 of FIG. 4 and only the significant differences are discussed below.

Referring now to FIG. 6, interconnection balls 668 are attached to upper traces 114, e.g., terminals thereof, prior to formation of package body 134. In one embodiment, interconnection balls 668 are formed of solder, e.g., are solder balls.

In another embodiment, interconnection balls 668 are formed of a non-melting and/or non-collapsing material, e.g., are copper. In accordance with this embodiment, interconnection balls 668 do not melt or collapse during reflow as discussed further below.

After formation of interconnection balls 668, package body 134 is formed as discussed above. In accordance with this embodiment, package body 134 completely encloses interconnection balls 668.

After formation of package body 134, via apertures 670 are formed in package body 134 to expose interconnection balls 668. Via apertures 670 penetrate into package body 134 from principal surface 134P.

In one embodiment, via apertures 670 are formed using a laser-ablation process. More particularly, a laser is repeatedly directed at principal surface 134P perpendicularly to principal surface 134P. This laser ablates, i.e., removes, portions of package body 134 leaving via apertures 670.

Although a laser-ablation process for formation of via apertures 670 is set forth above, in other embodiments, other via aperture formation techniques are used. For example, via apertures 670 are formed using selective molding, milling, mechanical drilling, high pressure water drilling, burning, honing, grinding, electro discharge machining, chemical etching and/or other via aperture formation techniques.

As illustrated in FIG. 6, via apertures 670 extend between principal surface 134P of package body 134 and interconnection balls 668. Accordingly, interconnection balls 668 are exposed by via apertures 670.

Electrically conductive bumps 464, e.g., solder, are formed on terminals 148 of flexible circuit connector 140. Bumps 464 are placed into contact with interconnection balls 668 and extend within via apertures 670 in accordance with this example. Bumps 464 and/or interconnection balls 668 are then reflowed, i.e., heated to a melt and then cooled to re-solidify.

Figure 7:
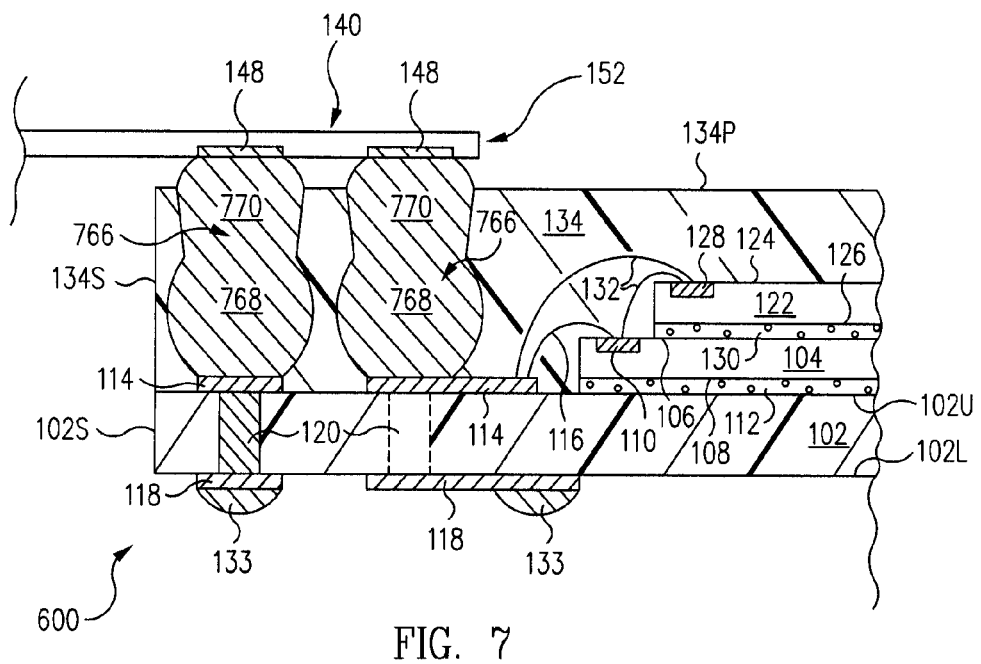
FIG. 7 is a cross-sectional view of the flex circuit package of FIG. 6 after reflow in accordance with one embodiment.

FIG. 7 is a cross-sectional view of flex circuit package 600 of FIG. 6 after reflow in accordance with one embodiment. Referring now to FIGS. 6 and 7 together, bumps 464 and interconnection balls 668 fuse together during reflow to form electrically conductive columns 766. Columns 766 extend between, directly contact, and electrically connect traces 114, e.g., terminals thereof, and terminals 148 of flexible circuit connector 140. Electrically conductive columns 766 protrude above principal surface 134P of package body 134 thus facilitating connection with terminals 148 of flexible circuit connector 140.

In accordance with this embodiment, columns 766 have lower spherical portions 768 corresponding to interconnection balls 668 connected to traces 114. Columns 766 further have upper conical frustum portions 770 (or cylindrical portions depending upon the embodiment) corresponding to via apertures 670 connected to terminals 148 of flexible circuit connector 140. It is to be understood that spherical portions 768 and conical frustum portions 770 (or cylindrical portions depending upon the embodiment) may not be exactly spherical and conical frustums (or cylindrical) but only substantially spherical and conical frustum (or cylindrical) depending upon the particular shape of interconnection balls 668 and via apertures 670 and the degree of deformation during reflow.

Figure 8:
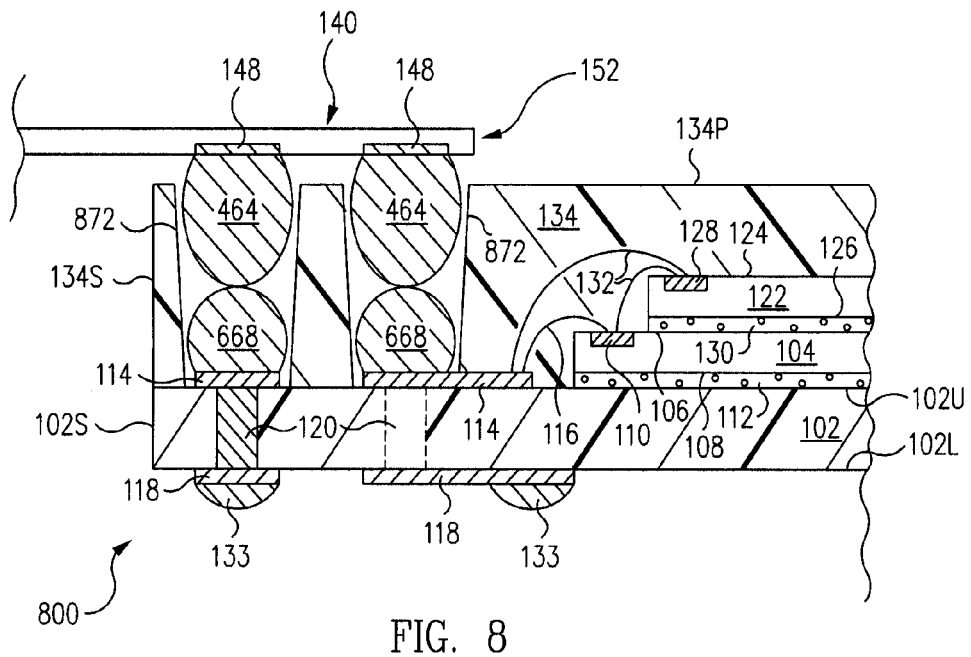
FIG. 8 is a cross-sectional view of a flex circuit package during fabrication in accordance with another embodiment.

FIG. 8 is a cross-sectional view of a flex circuit package 800 during fabrication in accordance with another embodiment. Flex circuit package 800 of FIG. 8 is similar to flex circuit package 600 of FIG. 6 and only the significant differences are discussed below.

Referring now to FIG. 8, interconnection balls 668, e.g. solder balls, are attached to upper traces 114, e.g., terminals thereof, prior to formation of package body 134. After formation of interconnection balls 668, package body 134 is formed as discussed above. In accordance with this embodiment, package body 134 completely encloses interconnection balls 668.

After formation of package body 134, via apertures 872 are formed in package body 134 to expose interconnection balls 668. Via apertures 872 penetrate into package body 134 from principal surface 134P.

In one embodiment, via apertures 872 are formed using a laser-ablation process. More particularly, a laser is repeatedly directed at principal surface 134P perpendicularly to principal surface 134P. This laser ablates, i.e., removes, portions of package body 134 leaving via apertures 872.

Although a laser-ablation process for formation of via apertures 872 is set forth above, in other embodiments, other via aperture formation techniques are used. For example, via apertures 872 are formed using selective molding, milling, mechanical drilling, high pressure water drilling, burning, honing, grinding, electro discharge machining, chemical etching and/or other via aperture formation techniques.

As illustrated in FIG. 8, via apertures 872 extend between principal surface 134P of package body 134 and upper surface 102U of substrate 102. Accordingly, interconnection balls 668 are exposed by via apertures 872. Further, via apertures 872 are larger than the terminals of upper traces 114 such that portions of upper surface 102U of substrate 102 around upper traces 114 are exposed. Further, via apertures 872 are larger than interconnection balls 668 such that interconnection balls 668 do not contact package body 134 in this embodiment.

In accordance with another embodiment, interconnection balls 668, e.g. solder balls, are attached to upper traces 114, e.g., terminals thereof, after formation of package body 134 and via apertures 872.

Electrically conductive bumps 464, e.g., solder, are formed on terminals 148 of flexible circuit connector 140. Bumps 464 are placed into contact with interconnection balls 668 and extend within via apertures 872 in accordance with this example. Bumps 464 and/or interconnection balls 668 are then reflowed, i.e., heated to a melt and then cooled to re-solidify, to form electrically conductive columns electrically connecting upper traces 114 to terminals 148 of flexible circuit connector 140 in a manner similar to that set forth above regarding flex circuit package 400 of FIG. 5.

Figure 9:
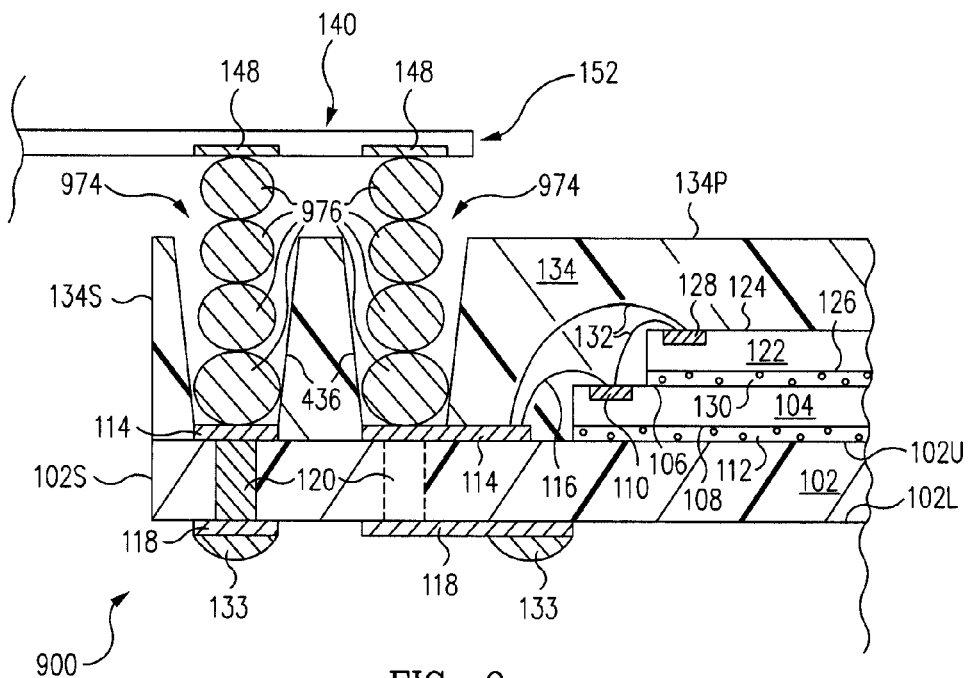
FIG. 9 is a cross-sectional view of a flex circuit package during fabrication in accordance with another embodiment.

FIG. 9 is a cross-sectional view of a flex circuit package 900 during fabrication in accordance with one embodiment. Flex circuit package 900 of FIG. 9 is similar to flex circuit package 400 of FIG. 4 and only the significant differences are discussed below.

Referring now to FIG. 9, in accordance with this embodiment, flex circuit package 900 includes through via apertures 436. Through via apertures 436 are formed in a manner similar to that discussed above regarding through via apertures 136 of flex circuit package 100 of FIG. 1 and so the description is not repeated here.

After formation, through via apertures 436 are filled with electrically conductive interconnection ball stacks 974. Interconnection ball stacks 974 are formed of interconnection balls 976 stacked one upon another. In one embodiment, interconnection balls 976 are formed of solder, e.g., are solder balls.

In another embodiment, interconnection balls 976 are formed of a non-melting and/or non-collapsing material, e.g., are copper. In accordance with this embodiment, interconnection balls 976 do not melt or collapse during reflow as discussed further below.

Although interconnection ball stacks 974 as illustrated in FIG. 9 include four interconnection balls 976 stacked one upon another, in other embodiments, more or less than four interconnection balls 976 are stacked to form an interconnection ball stack 974.

Interconnection ball stacks 974 are formed on upper traces 114, e.g., terminals thereof. Interconnection ball stacks 974 extend through through via apertures 436 and protrude above principal surface 134P of package body 134.

By stacking a plurality of interconnection balls 976 to form interconnection ball stacks 974, interconnection ball stacks 974 are formed with a minimum width, and thus pitch. Stated another way, stacking interconnection balls 976 allows interconnection ball stacks 974 to have a relatively large height to extend from upper traces 114 to above principal surface 134P of package body 134 while at the same time minimizes the diameter of interconnection ball stacks 974.

As further illustrated in FIG. 9, terminals 148 of flexible circuit connector 140 are placed into contact with interconnection ball stacks 974, and more particularly, with the top interconnection balls 976. The assembly is then heated to reflow interconnection ball stacks 974 to electrically connect upper traces 114, e.g., terminals thereof, to terminals 148 of flexible circuit connector 140.

After reflow of interconnection ball stacks 974, flex circuit package 900 is essentially identical if not exactly identical to flex circuit package 400 as illustrated in FIG. 5. More particular, referring now to FIGS. 5 and 9 together, interconnection balls 976 of interconnection ball stacks 974 are fused together during reflow to form electrically conductive columns 566.

Figure 10:
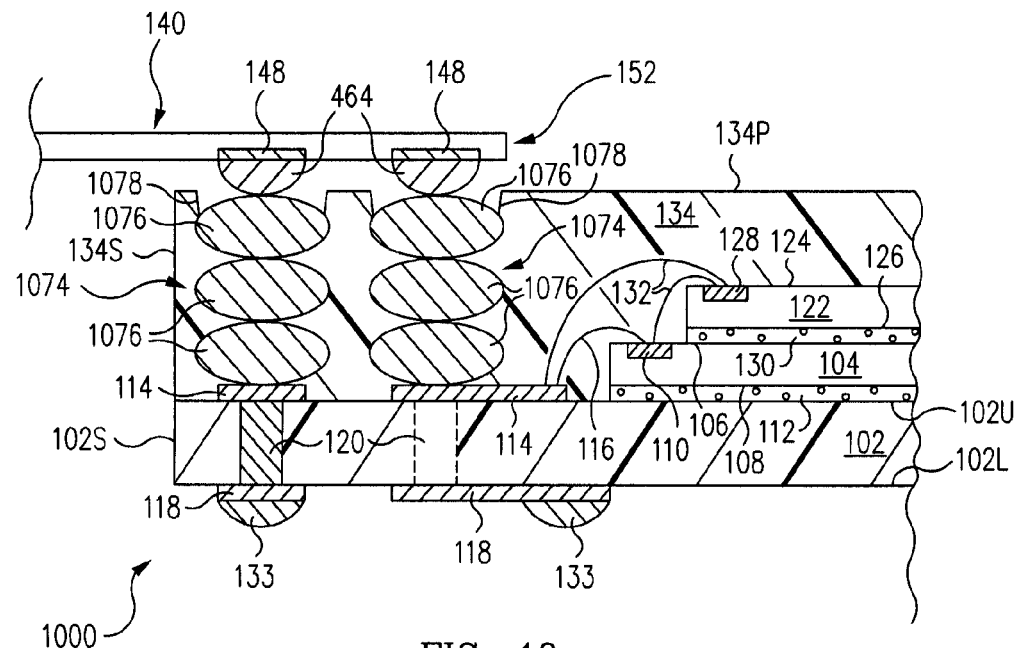
FIG. 10 is a cross-sectional view of the flex circuit package of FIG. 10A at a later stage during fabrication in accordance with one embodiment.
Figure 10A:
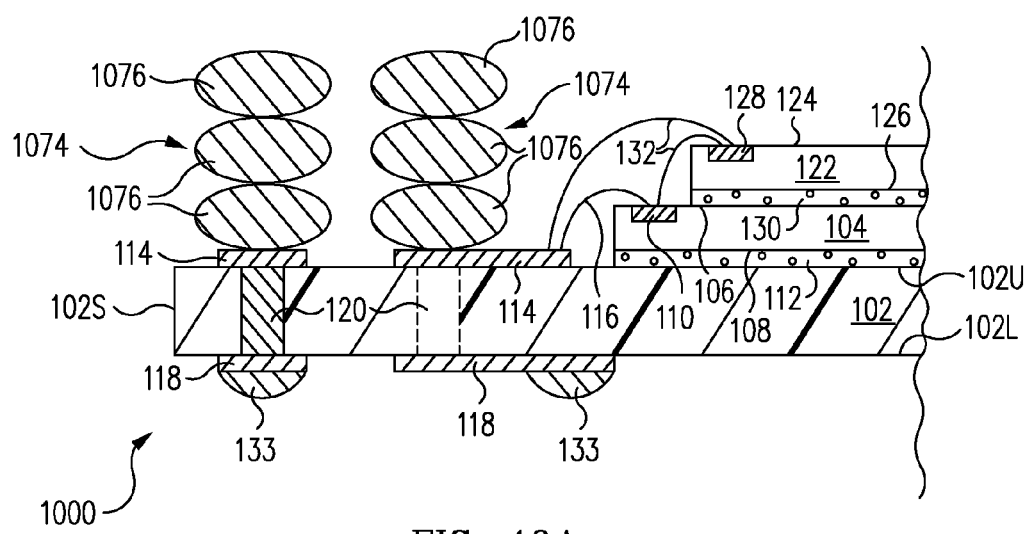
FIG. 10A is a cross-sectional view of a flex circuit package during fabrication in accordance with yet another embodiment.

FIG. 10A is a cross-sectional view of a flex circuit package 1000 during fabrication in accordance with yet another embodiment. Flex circuit package 1000 of FIG. 10A is similar to flex circuit package 900 of FIG. 9 and only the significant differences are discussed below. FIG. 10 is a cross-sectional view of flex circuit package 1000 of FIG. 10A at a later stage during fabrication in accordance with one embodiment.

Referring now to FIG. 10A, interconnection ball stacks 1074 are attached to upper traces 114, e.g., terminals thereof, prior to formation of package body 134. After formation of interconnection ball stacks 1074, referring now to FIG. 10, package body 134 is formed as discussed above. In accordance with this embodiment, package body 134 completely encloses interconnection ball stacks 1074.

Interconnection ball stacks 1074 are formed of interconnection balls 1076 stacked one upon another. In one embodiment, interconnection balls 1076 are formed of solder, e.g., are solder balls.

In another embodiment, interconnection balls 1076 are formed of a non-melting and/or non-collapsing material, e.g., are copper. In accordance with this embodiment, interconnection balls 1076 do not melt or collapse during reflow as discussed further below.

Although interconnection ball stacks 1074 as illustrated in FIG. 10 include three interconnection balls 1076 stacked one upon another, in other embodiments, more or less than three interconnection balls 1076 are stacked to form an interconnection ball stack 1074.

After formation of package body 134, via apertures 1078 are formed in package body 134 to expose the top interconnection balls 1076 of interconnection ball stacks 1074. Via apertures 1078 penetrate into package body 134 from principal surface 134P.

In one embodiment, via apertures 1078 are formed using a laser-ablation process. More particularly, a laser is repeatedly directed at principal surface 134P perpendicularly to principal surface 134P. This laser ablates, i.e., removes, portions of package body 134 leaving via apertures 1078.

Although a laser-ablation process for formation of via apertures 1078 is set forth above, in other embodiments, other via aperture formation techniques are used. For example, via apertures 1078 are formed using selective molding, milling, mechanical drilling, high pressure water drilling, burning, honing, grinding, electro discharge machining, chemical etching and/or other via aperture formation techniques.

As illustrated in FIG. 10, via apertures 1078 extend between principal surface 134P of package body 134 and the top interconnection balls 1076 of interconnection ball stacks 1074. Accordingly, the top interconnection balls 1076 of interconnection ball stacks 1074 are exposed by via apertures 1078.

Electrically conductive bumps 464, e.g., solder, are formed on terminals 148 of flexible circuit connector 140. Bumps 464 are placed into contact with interconnection ball stacks 1074, i.e., the top interconnection balls 1076 of interconnection ball stacks 1074. Electrically conductive bumps 464 extend within via apertures 1078 in accordance with this example. Bumps 464 and/or interconnection ball stacks 1074 are then reflowed, i.e., heated to a melt and then cooled to re-solidify.

Figure 11:
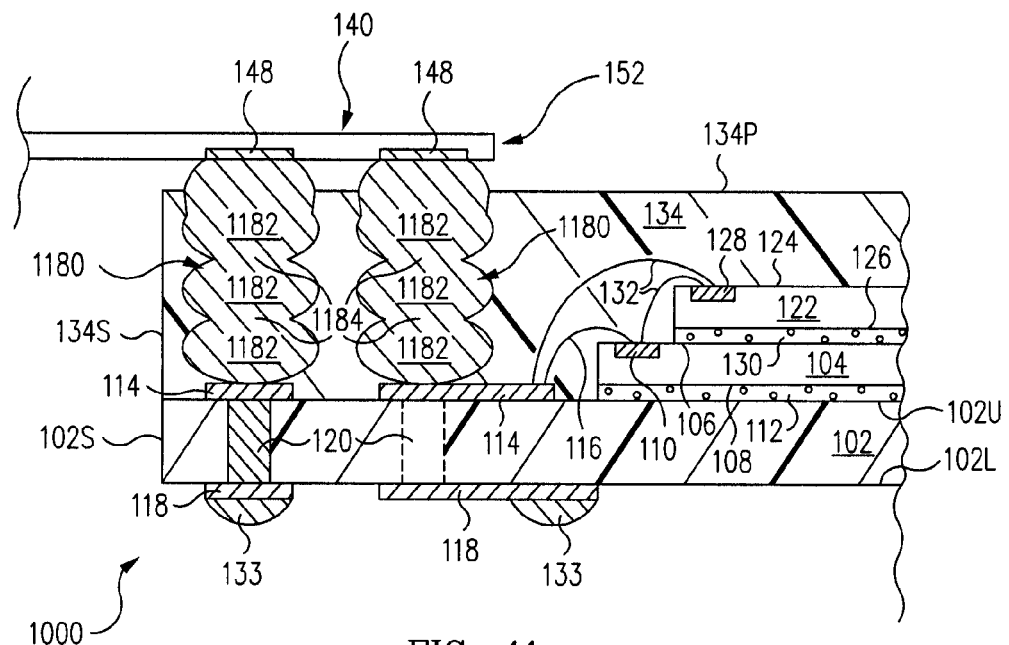
FIG. 11 is a cross-sectional view of the flex circuit package of FIG. 10 after reflow in accordance with one embodiment.

FIG. 11 is a cross-sectional view of flex circuit package 1000 of FIG. 10 after reflow in accordance with one embodiment. Referring now to FIGS. 10 and 11 together, bumps 464 and interconnection ball stacks 1074 fuse together during reflow to form electrically conductive columns 1180. Columns 1180 extend between and electrically connect traces 114, e.g., terminals thereof, and terminals 148 of flexible circuit connector 140. Columns 1180 protrude above principal surface 134P of package body 134 thus facilitating connection with terminals 148 of flexible circuit connector 140.

In accordance with this embodiment, columns 1180 have a repetitive ball like (spherical) shape corresponding to interconnection ball stacks 1074. More particularly, columns 1180 include spherical portions 1182 and necks 1184 between spherical portions 1182. Necks 1184 have a smaller diameter than spherical portions 1182. It is to be understood that spherical portions 1182 and may not be exactly spherical but only substantially spherical depending upon the particular shape of interconnection balls 1076 and the degree of deformation during reflow.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A flex circuit package comprising:
    an electronic component mounted to a first surface of a substrate;
    first traces on the first surface of the substrate, the first traces being electrically connected to the electronic component;
    a package body enclosing the electronic component and the first surface of the substrate;
    columns physically and electrically connected to the first traces, the columns comprising non-collapsing material extending through the package body, the columns comprising:
        spherical portions enclosed within the package body; and
        necks between the spherical portions, the necks having a smaller diameter than the spherical portions; and
    a flexible circuit connector having first terminals connected to the columns.

2. The flex circuit package of claim 1 further comprising bumps electrically connecting the first terminals of the flexible circuit connector to the columns.

3. The flex circuit package of claim 1 wherein the flexible circuit connector comprises:
    a dielectric substrate; and
    a circuit on the dielectric substrate, the circuit comprising the first terminals.

4. The flex circuit package of claim 1 wherein the flexible circuit connector comprises a first end comprising the first terminals.

5. The flex circuit package of claim 4 wherein the flexible circuit connector further comprises a second end comprising second terminals.

6. The flex circuit package of claim 5 wherein the first terminals are electrically connected to the second terminals by a circuit of the flexible circuit connector.

7. The flex circuit package of claim 5 wherein the second terminals provide an electrical interconnection structure for electrical connection to a second electronic component structure.

8. The flex circuit package of claim 1 wherein the columns directly contact the first traces and the first terminals.

9. The flex circuit package of claim 1 wherein the columns protrude above a principal surface of the package body.

10. A flex circuit package comprising:
    an electronic component mounted to a first surface of a substrate;
    first traces on the first surface of the substrate, the first traces being electrically connected to the electronic component;
    a package body enclosing the electronic component and the first surface of the substrate; and
    interconnection ball stacks physically and electrically connected to the first traces, the interconnection ball stacks comprising non-collapsing material extending through the package body, the interconnection ball stacks comprising at least three interconnection balls stacked one upon another.

11. The flex circuit package of claim 10 further comprising through via apertures formed in the package body prior to formation of the interconnection ball stacks, the interconnection ball stacks being formed in the through via apertures.

12. The flex circuit package of claim 10 wherein the package body is formed after the interconnection ball stacks are formed such that the package body completely encloses the interconnection ball stacks.

13. The flex circuit package of claim 10 further comprising a flexible circuit connector having first terminals in contact with the interconnection ball stacks.

14. A flex circuit package comprising:
    an electronic component mounted to a first surface of a substrate;
    first traces on the first surface of the substrate, the first traces being electrically connected to the electronic component;
    a package body enclosing the electronic component and the first surface of the substrate; and
    columns physically and electrically connected to the first traces, the columns comprising non-collapsing material extending through the package body, the columns comprising:
    spherical portions enclosed within the packaged body; and
    necks between the spherical portions, the necks having a smaller diameter than the spherical portions.

15. The flex circuit package of claim 1 wherein the non-collapsing material comprises copper.

16. The flex circuit package of claim 1 wherein the non-collapsing material has a higher melting temperature than solder.

17. The flex circuit package of claim 10 wherein the non-collapsing material comprises copper.

18. The flex circuit package of claim 10 wherein the non-collapsing material has a higher melting temperature than solder.

19. The flex circuit package of claim 14 wherein the non-collapsing material comprises copper.

20. The flex circuit package of claim 14 wherein the non-collapsing material has a higher melting temperature than solder.

* * * * *